United States Patent [19]

Hanson et al.

[11] Patent Number: 5,140,825
[45] Date of Patent: Aug. 25, 1992

[54] METHOD OF OPERATING A TRANSPORT REFRIGERATION UNIT

[75] Inventors: Jay L. Hanson, Bloomington; Doyle G. Herrig, Elko, both of Minn.

[73] Assignee: Thermo King Corporation, Minneapolis, Minn.

[21] Appl. No.: 728,471

[22] Filed: Jul. 11, 1991

[51] Int. Cl.$^5$ .................. G01R 31/00; F25B 49/00
[52] U.S. Cl. .......................... 62/89; 62/127; 324/503
[58] Field of Search .............. 236/94; 165/11.1; 62/125, 127, 89; 324/503

[56] References Cited

U.S. PATENT DOCUMENTS

| | | | |
|---|---|---|---|
| 4,207,611 | 6/1980 | Gordon | 324/503 X |
| 4,617,510 | 10/1980 | Deicke et al. | 324/503 |
| 4,663,725 | 5/1987 | Truckenbrod | 364/505 |
| 4,725,959 | 6/1988 | Matsumoto | 324/503 X |
| 4,884,033 | 11/1989 | McConchie, Sr. | 324/503 |
| 4,918,932 | 4/1990 | Gustafson et al. | 62/89 |

Primary Examiner—William E. Wayner
Attorney, Agent, or Firm—D. R. Lackey

[57] ABSTRACT

A method of automatically checking components and associated wiring of electrical control associated with a microprocessor controlled transport refrigeration system. The transport refrigeration system has a prime mover which drives a refrigerant compressor and an alternator. The control includes a battery and a current shunt which measures battery current. During the automatic checking procedure, the prime mover is off, to provide a zero alternator output. Upper and lower battery current draw limits are provided for each component to be checked. Each of the components to be checked is energized and de-energized, with the microprocessor individually and successively connecting each component to, and disconnecting it from, the battery. The microprocessor compares the battery current draw of each component, when energized, with the associated battery current draw limits. An alarm is provided when a battery current draw is outside the associated draw limits, with the alarm identifying the associated component.

9 Claims, 12 Drawing Sheets

METHOD OF OPERATING A TRANSPORT REFRIGERATION UNIT

TECHNICAL FIELD

The invention relates in general to transport refrigeration units, and more specifically to transport refrigeration units which have microprocessor based electrical control.

BACKGROUND ART

U.S. Pat. No. 4,663,725, which is assigned to the same assignee as the present application, discloses the use of microprocessor based transport refrigeration control for use with a refrigerated container, with the refrigerant compressor being driven by an electric motor. This patent is directed primarily to the use of a microprocessor to operate the various components of the refrigeration system according to predetermined algorithms, and to detect and record faults which occur during the operation thereof.

U.S. Pat. No. 4,918,932, which is assigned to the same assignee as the present application, discloses the use of a microprocessor to determine average error between an operator selected set point temperature and the temperature of a space to be conditioned, using the outputs of return air and discharge air sensors, and the use the average error in the determination of an error signal which modulates the capacity of the system.

While these patents ably utilize the capabilities of a microprocessor during the operation of a transport refrigeration system, it would be desirable, and it is an object of the present invention, to expand the use of the microprocessor which operates the unit, enabling it to aid in the test of the unit at the time of manufacture as well as providing unique features in pre-trip diagnostics which the operator puts the unit through prior to leaving a terminal with a new load.

SUMMARY OF THE INVENTION

Briefly, the present invention is a method of operating a transport refrigeration unit which has microprocessor based electrical control for controlling the temperature of a conditioned space to a selected set point temperature. The same microprocessor which operates the unit when it is controlling the temperature of a served space, is used when the unit is not running to perform a series of DC voltage and current tests.

The testing or checking of the transport refrigeration unit includes the individual energization and de-energization of selected electrical control components while measuring DC current flow from the unit battery, as well as measuring current flow to predetermined combinations of electrical components which cooperatively perform certain refrigeration functions.

Comparing the battery current flow with predetermined permissible ranges stored in microprocessor memory for each sequence of the test procedure enables the microprocessor to generate fault codes and signals which pinpoint defective components and/or the associated wiring.

The test procedure is automatic and can be utilized during manufacture by test personnel to detect faulty and incorrect wiring as well as faulty components, and the operator of a unit can initiate the same test procedure as part of the normal pre-trip requirements.

BRIEF DESCRIPTION OF THE DRAWINGS

The invention will become more apparent by reading the following detailed description in conjunction with the drawings, which are shown by way of example only, wherein.

DESCRIPTION OF PREFERRED EMBODIMENTS

Figure 1:
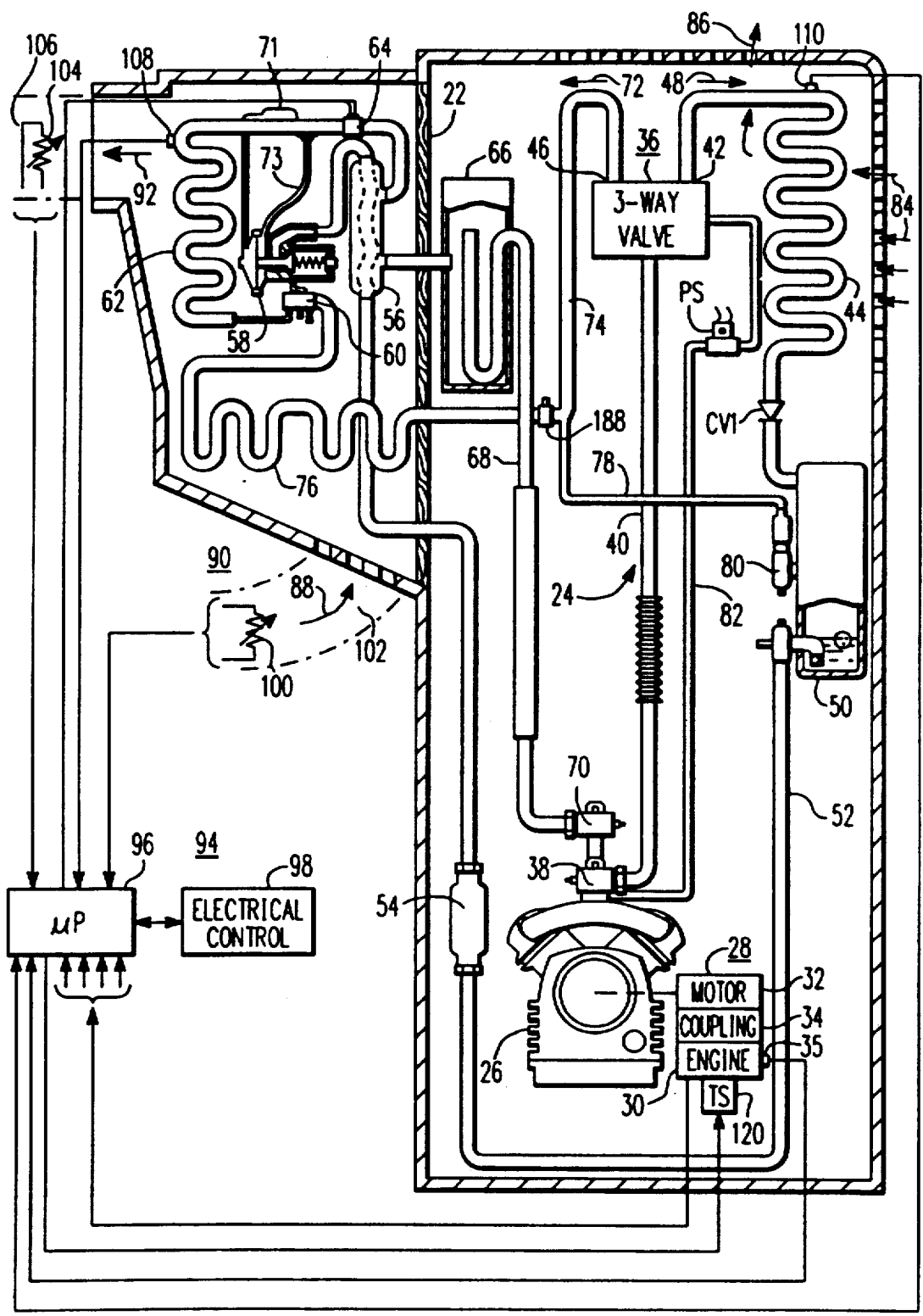
FIG. 1 is a partially block and partially schematic diagram of a refrigeration system which may utilize the methods of the invention.

Referring now to the drawing, and to FIG. 1 in particular, there is shown a transport refrigeration unit 20 which may utilize the methods of the invention. Refrigeration unit 20 may be mounted on a container, truck, or trailer, such as on a wall 22 thereof, for example. Refrigeration unit 20 has a closed fluid refrigerant circuit 24 which includes a refrigerant compressor 26 driven by a prime mover arrangement 28. Prime mover arrangement, 28 includes an internal combustion engine 30, and it may optionally include a stand-by electric motor 32. Engine 30 and motor 32 are coupled to compressor 26 by a suitable clutch or coupling 34 which disengages engine 30 while motor 32 is operative. A selector 35 selects one of the two prime movers and provides an output signal to identify the selection.

Discharge ports of compressor 26 are connected to an inlet port of a three-way valve 36 via a discharge service valve 38 and a hot gas line 40. The functions of three-way valve 36, which selects heating and cooling cycles, may be provided by two separate valves, if desired. Three-way valve 36 has a first output port 42, which is selected to initiate a cooling cycle, with the first output port 42 being connected to the inlet side of a condenser coil 44. Three-way valve 36 has a second outlet port 46, which is selected to initiate a heating cycle, as will be hereinafter described.

When three-way valve 36 selects the cooling cycle output port 42, it connects compressor 26 in a first refrigerant circuit 48, which in addition to condenser 44, includes a one-way condenser check valve CV1, a receiver 50, a liquid line 52, a refrigerant drier 54, a heat exchanger 56, an expansion valve 58, a refrigerant distributor 60, an evaporator coil 62, an optional controllable suction line modulation valve 64, another path through heat exchanger 56, an accumulator 66, a suction line 68, and back to a suction port of compressor 26 via a suction line service valve 70. The operative prime mover may be protected against overload by controlling modulation valve 64 to provide the function of a conventional compressor throttling valve, as taught by U.S. Pat. No. 4,977,751, which is assigned to the same assignee as the present application; or, a conventional compressor throttling valve may be disposed in suction line 68, as desired. Expansion valve 58 is controlled by a thermal bulb 71 and an equalizer line 73.

When three-way valve 36 selects the heating cycle output port 46, it connects compressor 26 in a second refrigerant circuit 72. The second refrigerant circuit 72 by-passes condenser 44 and expansion valve 58, connecting the hot gas output of compressor 26 to the refrigerant distributor 60 via a hot gas line 74 and a defrost pan heater 76. A hot gas by-pass solenoid valve 77 may optionally be disposed in hot gas line 74. A by-pass or pressurizing line 78 connects hot gas line 74 to receiver 50 via by-pass and check valves 80, to force refrigerant from receiver 50 into an active refrigerant circuit during heating and defrost cycles.

A conduit or line 82 connects three-way valve 36 to the low side of compressor 26 via a normally closed pilot solenoid valve PS. When solenoid valve PS is de-energized and thus closed, three-way valve 18 is spring biased to select the cooling cycle output port 42. When evaporator 62 requires defrosting, and when the load being conditioned requires heat to maintain set point, pilot solenoid valve PS is energized to allow the low pressure side of compressor 26 to operate three-way valve 36 to select the heating cycle output port 46.

A condenser fan or blower (not shown) causes ambient air 84 to flow through condenser coil 44, with the resulting heated air 86 being discharged to the atmosphere. An evaporator fan or blower (not shown) draws air 88, called "return air", from a served space 90 whose air is to be conditioned, through the evaporator coil 62, and the resulting cooled or heated air 92, called "discharge air", is returned to the space 90. During an evaporator defrost cycle, the evaporator fan or blower is not operated, and a defrost air damper may be operated to close the discharge air path to the conditioned space 90.

Transport refrigeration unit 20 is controlled by microprocessor based electrical control 94 which includes a microprocessor 96 and electrical control 98. Electrical control 98 includes relays, and the like, as will be explained relative to FIGS. 2A and 2B. The microprocessor 96 receives input signals from appropriate sensors, such as from a return air temperature sensor 100 disposed in a suitable return air path 102, a discharge air temperature sensor 104 disposed in a suitable discharge air path 106, from a coil temperature sensor 108 disposed to sense the temperature of the evaporator coil 62, from a refrigerant pressure sensor (HPCO) 110 disposed on the high side of the refrigerant circuit 48, and from various engine sensors shown in FIG. 2B, such as oil level sensor 112, oil pressure sensor 114, engine coolant temperature sensor 116, and engine speed sensor 118. Microprocessor 96, among other things, controls modulation valve 64, hot gas solenoid valve 77, and a throttle or high speed solenoid 120. Other functions controlled by microprocessor 96 are shown in FIGS. 2A and 2B, and will be hereinafter described.

Figure 2A:
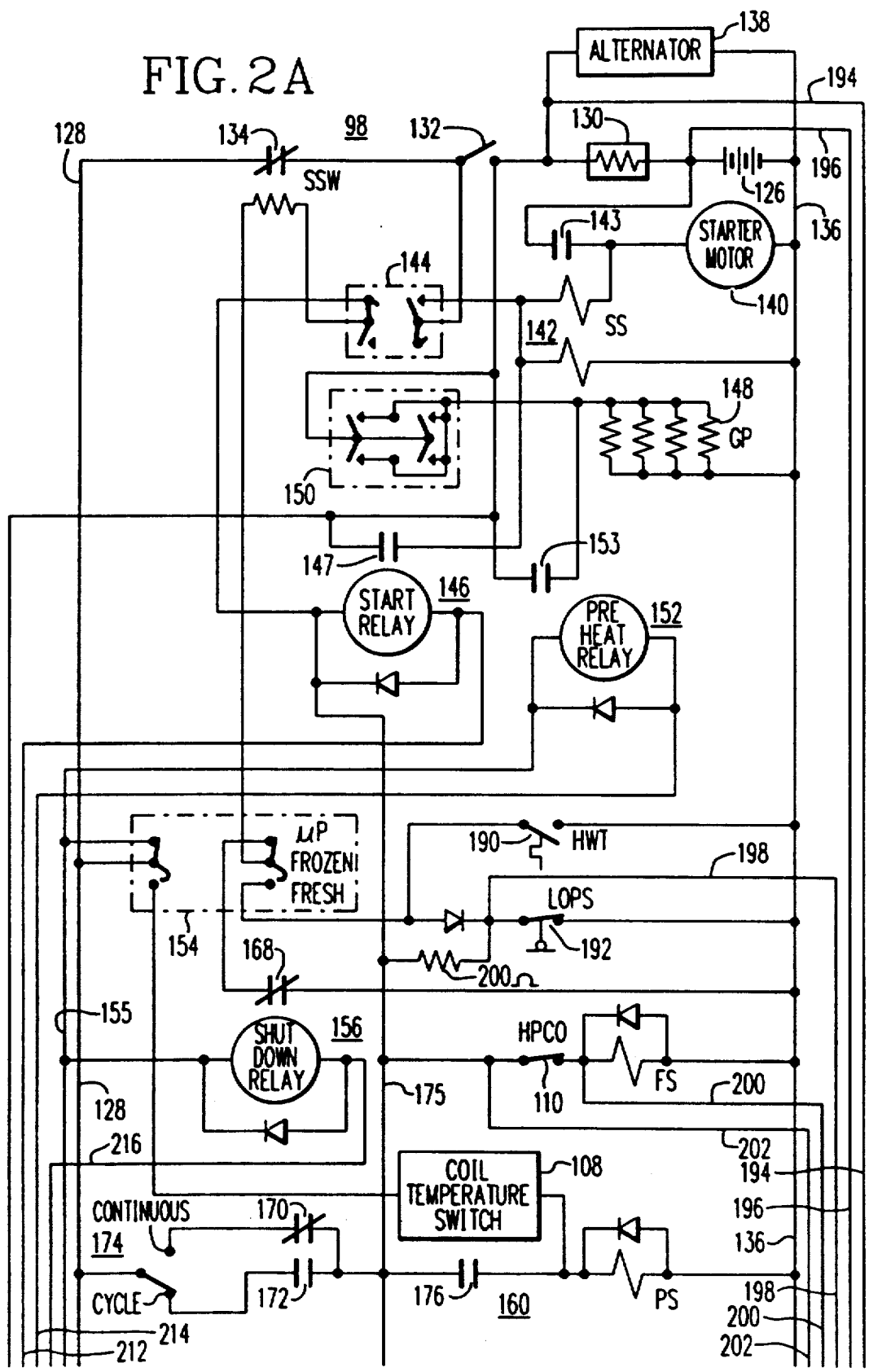
FIGS. 2A and 2B may be assembled to provide an electrical schematic diagram of microprocessor based electrical control shown in block form in FIG. 1.
Figure 2B:
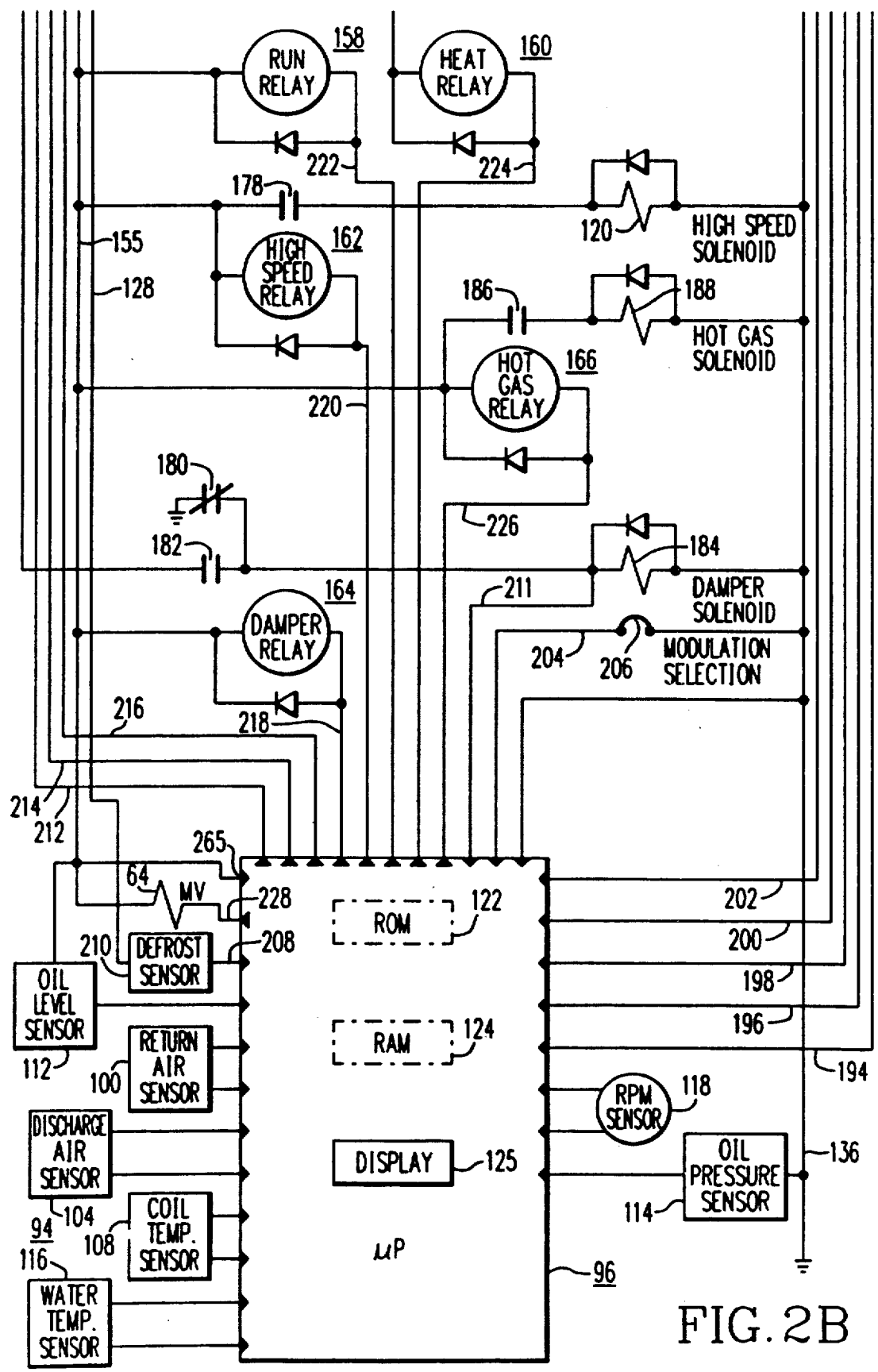

FIGS. 2A and 2B may be assembled to provide a detailed schematic diagram of microprocessor based electrical control 94, which includes microprocessor 96 and control 98. As is well known, microprocessor 96 includes a read-only memory (ROM) 122 for storing programs to be hereinafter described, and a random access memory (RAM) 124 for software timers, flags, input signals, output signals, and other values generated by the operating programs. Microprocessor 96 also includes a display 125 for displaying fault codes, system status indicating lights, and the like. Electrical control 98 includes a battery 126 which has one side connected to a first conductor 128 via a DC shunt 130, an on-off switch 132, and normally closed contacts 134 of a protective reset switch SSW. The remaining side of battery 126 is connected to conductor 136, which is grounded. Control 98 further includes an alternator 138 driven by prime mover 28; a starter motor 140, for cranking engine 30, which is controlled by a starter solenoid 142 having associated normally open contacts 143, an ignition switch 144, and a start relay 146 having associated normally open contacts 147; and glow plug resistors (GP) 148, for pre-heating engine 30, which are controlled by a pre-heat switch 150 and by a pre-heat relay 152 which has normally open contacts 153.

Control 98 also includes a three-position switch 154 which has two banks of three terminals each comprising a center terminal and upper and lower terminals, with reference to FIG. 2A. Switch 154, in the illustrated upper position which connects the center terminal to the upper terminal, places unit 20 under control of the microprocessor 96. The upper position provides voltage from conductor 128 to a conductor 155. An intermediate position of switch 154, in which the center terminal is not connected to either the upper terminal or the lower terminal, is selected when the microprocessor 96 is not utilized and the load in the conditioned space 90 is frozen. This switch position will cause unit 20 to operate continuously in a low speed cool mode. The lower position of switch 154 is selected when the microprocessor 96 is not utilized and the load in the conditioned space is fresh. This position of switch 154 will cause unit 10 to operate continuously, cycling between heating and cooling cycles under the control of the hereinbefore mentioned coil temperature switch 108. Coil temperature switch 108 is preset to close at a predetermined coil temperature, such as 35 degrees F., to energize the pilot solenoid PS and initiate a heating cycle, and to open at a predetermined higher temperature, such as 38 degrees F., to de-energize pilot solenoid PS and initiate a cooling cycle.

In addition to the relays already mentioned, control 98 includes a shutdown relay 156, a run relay 158, a heat relay 160, a high speed relay 162, a defrost damper relay 164, and a hot gas relay 166. Shutdown relay 156 is normally energized, and is de-energized to shut unit 10 down via its associated set of normally-closed contacts 168 which ground the protective switch SSW and cause it to open its contacts 134. The run relay 158 has normally-closed and normally open contacts 170 and 172, respectively, connected to a mode selector switch 174 which has an input connected to conductor 128. Selector switch 174 selects either a continuous operating mode in which the prime mover 28 operates continuously, or a cycling start-stop mode, also called "cycle sentry", which includes starting and stopping the prime mover 28.

The normally-closed contacts 170 of run relay 158 are connected to the "continuous" position of selector switch 174, and the normally-open contacts 172 of run relay 158 are connected to the "cycling" position of selector switch 174. Contacts 170 or contacts 172 provide voltage to a conductor 175 from conductor 128 and selector switch 174.

Heat relay 160 has a set of normally open contacts 176 for controlling the pilot solenoid PS. High speed relay 162 has a set of normally open contacts 178 for controlling the high speed solenoid 120. Damper relay has a set of normally closed contacts 180 and a set of normally open contacts 182, connected to control a defrost damper solenoid 184. Hot gas relay 166 is provided for controlling the hot gas solenoid valve 77 via a set of normally open contacts 186, when a hot gas solenoid 77 is provided in hot gas line 74.

Control 98 also includes a engine coolant temperature switch (high water temperature —HWT) 190, which closes when the engine coolant reaches a predetermined elevated temperature, and a low oil pressure switch (LOPS) 192 which is open as long as engine pressure is normal. The closing of either switch 190 or 192 will shut unit 20 down via the manual reset switch SSW.

Microprocessor 96 senses the voltage across DC shunt 130 via conductors 194 and 196, and can thus determine the magnitude and polarity of battery current. One polarity, which will be called positive, indicates the battery 126 is being charged by alternator 138, which also indicates the prime mover 28 is running. The other polarity, i.e., negative, indicates the battery is discharging.

Microprocessor 96 also has a conductor 198 which senses the position of the low oil pressure switch 192, conductors 200 and 202 which sense the voltage level on first and second sides, respectively, of the high refrigerant cut-out switch 110, a conductor 204 which senses whether or not a modulation valve selector jumper 206 has connected conductor 204 to system ground 136, a conductor 208 which senses whether or not a defrost sensor switch 210 has operated, signifying the need for a defrost cycle, and a conductor 211 which detects voltage on the damper solenoid 184.

Microprocessor 96 has a plurality of output conductors for controlling various functions, including conductors 212, 214, 216, 218, 220, 222, 224 and 226 for respectively controlling the operation of start relay 146, pre-heat relay 152, shutdown relay 156, damper relay 164, high speed relay 162, run relay 158, heat relay 160, and hot gas relay 166. A conductor 228 is also provided for controlling the current level in the modulation valve 64.

As the microprocessor functions are described, only those necessary to understanding the invention will be described in detail. Certain of the functions shown in block form, may be described in detail and claimed in concurrently filed application Ser. Nos. 728,464, 728,463, and 728,665.

Figure 3:
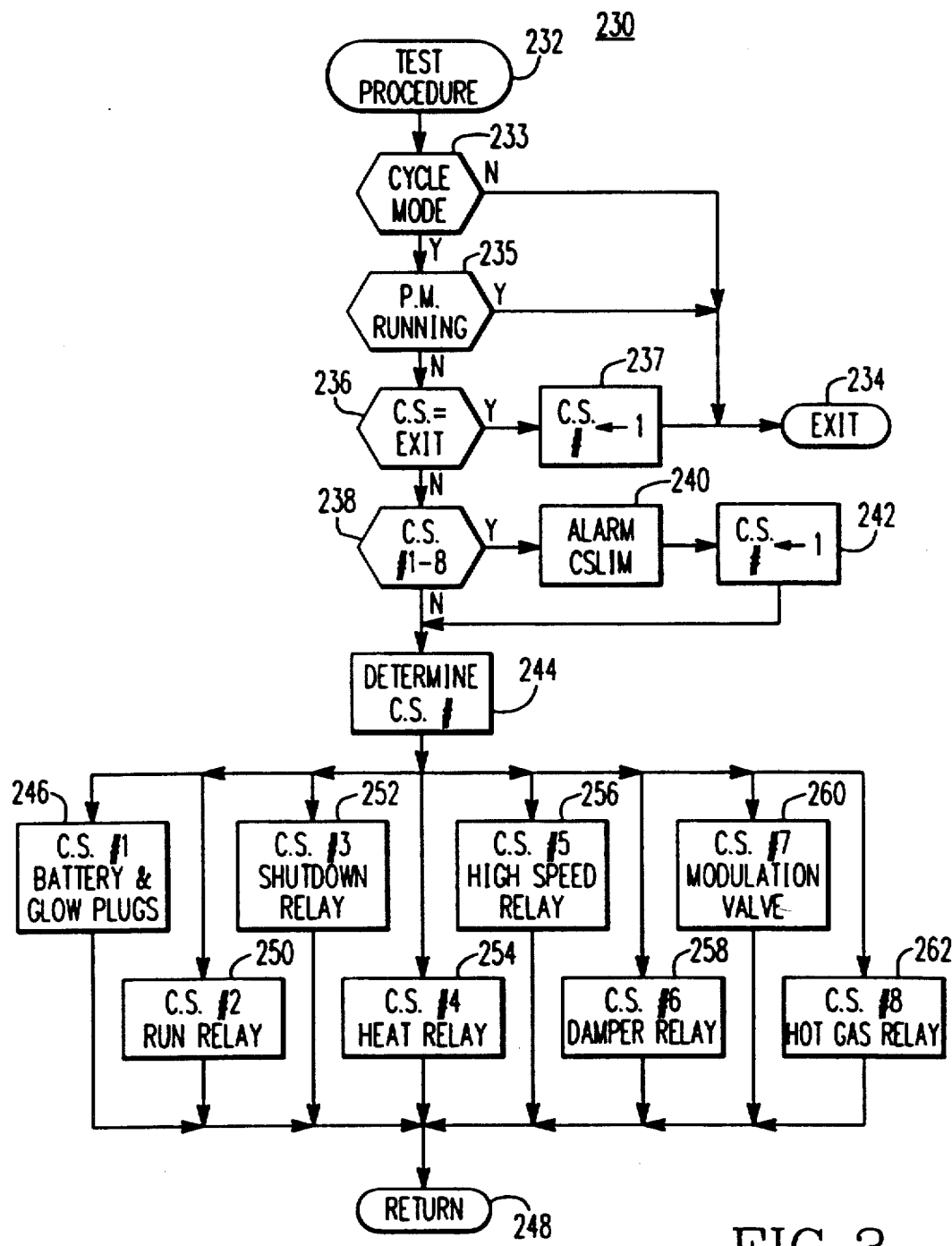
FIG. 3 is a flow diagram of a program which sets forth a microprocessor controlled direct current (DC) check of the wiring and electrical components of the electrical control shown in FIGS. 2A and 2B.

FIG. 3 is a flow diagram of a program 230 which implements a component and wiring testing procedure for checking and testing transport refrigeration unit 20 according to the teachings of the invention. The functions of program 230 may be incorporated into a pre-trip procedure which the operator initiates prior to using unit 20 to condition a new load, and it may also be used at the time of manufacture, either as part of testing the pre-trip function, or as a separate test, as desired. Test procedure or function 230 is entered at 232 and step 233 checks to make sure that selector switch 174 is in a position which selects a cycling mode, also called "cycle sentry", rather than a continuous-run mode, for the prime mover 28. The cycling mode position of selector switch 174 isolates conductor 175 from battery voltage until run relay 156 is energized. Thus, the test procedure 230 can selectively test run relay 156 and its associated circuitry, and the procedure can selectively energize and isolate conductor 175 for additional test procedures. If step 233 finds selector switch 174 in the continuous run position, the program exits at 234. An informational visible and/or audible signal may be produced to inform the operator to place selector switch 174 in the cycle sentry position.

If step 233 is satisfied, step 235 checks to make sure the prime mover 28 is not running. Unlike most diagnostic testing procedures for transport refrigeration systems, the present invention tests each transport refrigeration unit while the prime mover is stopped. The value of the disclosed procedure is in obtaining direct current (DC) information via the unit battery 126, and to do this correctly alternator 138 must not be providing an output voltage. Thus, if prime mover 28 is running, the program exits at 234. Again, an informational signal may be provided which notifies the operator or tester that the test cannot be performed while prime mover 28 is running.

Test function 230 comprises a plurality of individual successive tests, some of which are related and must be performed in a certain order, in order to successively isolate predetermined components, predetermined groups of components, and associated electrical wiring. Function 230 keeps track of which functions have been run and which must still be run during any requested test operation by assigning "case select" numbers to the individual test segments. Then, once function 230 initiates the test procedure, each test segment at the conclusion of its testing procedure, either changes the case select number to the next segment which should be run, or it provides a signal for use by function 230 which identifies that the test procedure has either been completed, or that it should be aborted for some reason.

Step 236 determines if case select, instead of being set to a number, has been set to "exit", which means the testing procedure has been completed. If case select is set to "exit", step 237 initializes the case select number to #1 so that the testing portion of the program will start at the correct location the next time the testing program is run. Step 237 may also notify the operator or tester that the test procedure has been completed, by providing a suitable signal.

If step 236 finds that case select is not set to "exit", step 238 determines if the case select number is in the range of viable numbers, such as 1 through 8 in the exemplary embodiment of the invention. If the case select number is not 1 through 8, step 240 sets an alarm CSLIM which indicates the case select number is out of limits, and step 242 sets the case select number to 1, to initialize the testing procedure to the correct starting point. If the case select number is in the correct range, step 244 determines what the case select number is, and then function 230 advances to a stage which runs the selected program. For example, when the testing function 230 is initially selected, the case select number should be number 1, because of step 237, or it will be set to number 1 by step 242. Case select number 1 identifies a function 246 which runs a check on battery 126, glow plug resistors 148, and associated wiring. Function 246 changes the case select number to 2 and returns at 248 to the starting point 232 of program 230.

On the next pass through program 230, function 250 will run, with function 250 checking run relay 158 and associated wiring. The next pass through program 230 runs function 252 which checks the shutdown relay 156, circuit protective switch SSW, and associated components and circuitry. In like manner, function 254 checks heat relay 160, pilot solenoid PS, and associated circuitry; function 256 checks high speed relay 162, the high speed solenoid 120, and associated circuitry; function 258 checks the defrost damper relay 164, damper solenoid 184, and associated circuitry; function 260 checks the controllable suction line modulation valve 64 and associated circuitry; and function 262 checks the hot gas by-pass relay 166, hot gas solenoid valve 77, and associated circuitry.

During the following discussions of programs which implement the various testing segments, it will be assumed that shutdown relay 156 will be in its energized state, unless stated otherwise, in order to keep the resistance of circuit protective switch SSW out of the battery circuit. Thus, the current limits stored in ROM 122 for each test will automatically include the current draw for shutdown relay 156, unless the test procedure specifically requests the de-energization of shutdown relay 156

Figure 4:
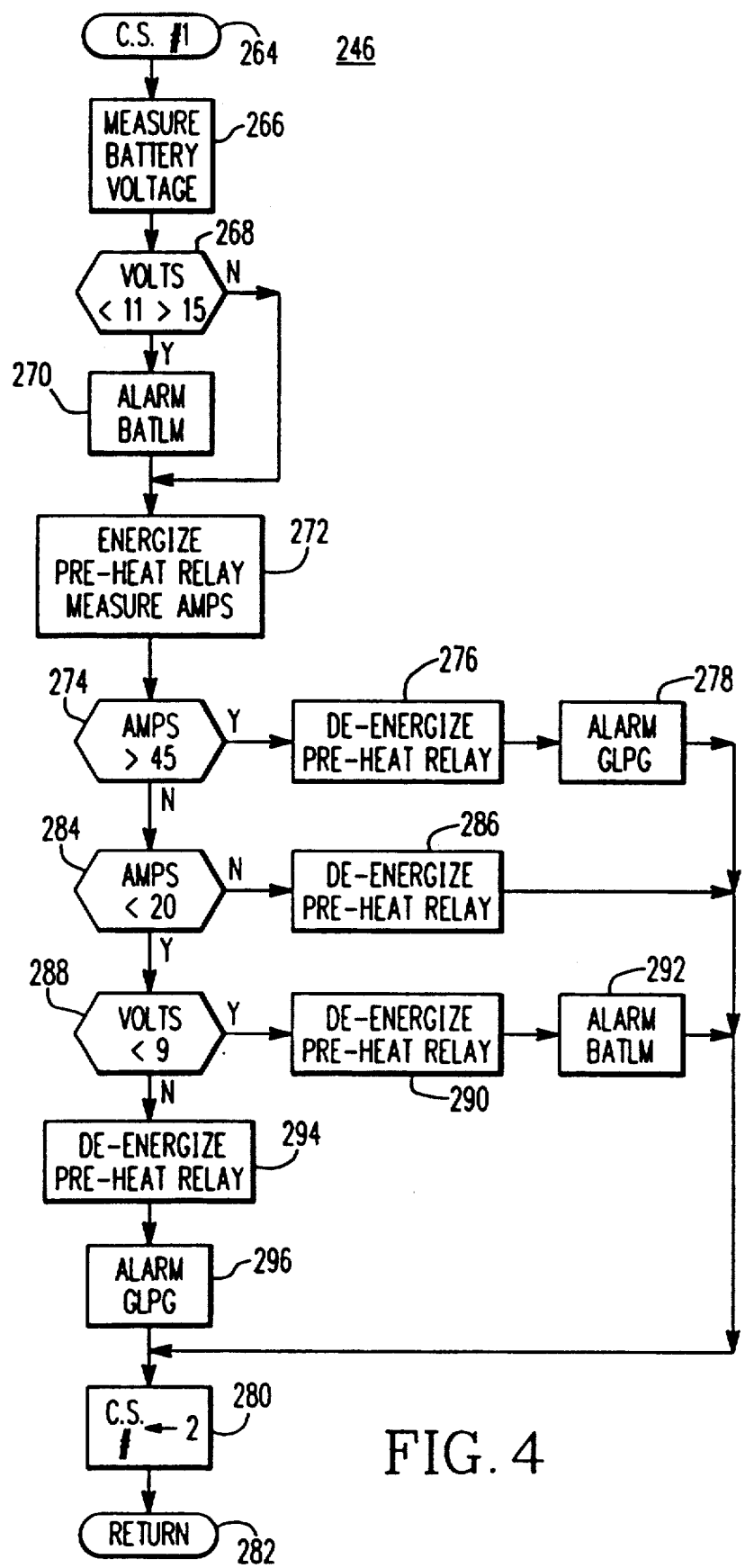
FIG. 4 is a flow diagram called by the program of FIG. 3 which successively checks the voltage of a battery, and the current drawn from the battery by engine glow plugs and associated circuitry.

A program 246 for implementing case select function #1 is set forth in FIG. 4, with program 246 being entered at 264. Step 266 measures the battery voltage between input line 196 in FIG. 2A and ground 136. Step 268 then compares the measured voltage with acceptable upper and lower limits which have been pre-stored in microprocessor ROM 122 or other non-volatile memory. For example, step 268 may compare the measured battery voltage with an upper limit of 15 volts and a lower limit of 11 volts for a battery nominally rated 12 volts. If comparison step 268 finds the battery voltage is less than 11 or greater than 15, step 270 sets an alarm BATLM which notifies the operator or tester that the battery voltage is outside its normal limits.

Step 270 and the "no" branch from step 268 proceed to step 272 which energizes pre-heat relay 152 via conductor 214 from microprocessor 96. Pre-heat relay 152 closes its set of normally open contacts 153 to energize glow plug resistors 148. Step 272 measures the resulting battery current flow via conductors 194 and 196 connected across DC shunt 130, step 274 obtains a predetermined upper current limit from memory 122, and step 274 also determines if the measured battery current in amperes exceeds the stored upper limit, which is 45 amperes in the exemplary embodiment. While battery discharge current normally has a negative sign, it will be assumed for purposes of this specification that it is positive, as it less confusing when determining if something is less than, or more than, a positive value.

If the comparison in step 274 finds the combined current draw of the pre-heat relay 152 and glow plug resistors exceeds the upper limit, step 276 de-energizes pre-heat relay 152 and step 278 sets an alarm GLPG which identifies the pre-heat relay and glow plug resistor components and associated circuitry as having a problem. The program then advances to step 280 which sets the case select number to 2, and the program returns to start 232 of function 230 at 282.

If the comparison of step 274 finds the measured battery current does not exceed the predetermined upper limit, step 284 checks to see if the measured battery current is less than a predetermined lower limit, e.g., 20 amperes. If the measured battery current is not less than 20 amperes, the measured battery current is in the proper range, step 286 de-energizes pre-heat relay 152, and the program proceeds to step 280.

If step 284 finds the measured battery current is below the predetermined lower limit, step 288 obtains an additional lower limit for the battery voltage from memory 122, with this additional lower voltage limit being lower than the lower voltage limit used in step 268, such as 9 volts instead of 11 volts. Step 288 compares the measured battery voltage, obtained in step 266, with the additional lower limit, and if the measured battery voltage is less than the additional lower limit, the program determines that the cause of the low current is battery 126. Thus, step 288 goes to step 290 which de-energizes pre-heat relay 152, and step 290 proceeds to step 292 which sets the alarm BATLM.

If the battery voltage is not below the additional lower limit, then the program determines that the cause of the low current is in the circuitry connected to battery 126. Thus, step 288 goes to step 294 which de-energizes pre-heat relay 152, and step 294 goes to step 296 which sets the alarm GLPG. Step 296 proceeds to the hereinbefore described step 280 which selects the next test segment which should be run, and program 246 returns to program 230 at 282.

Figure 5:
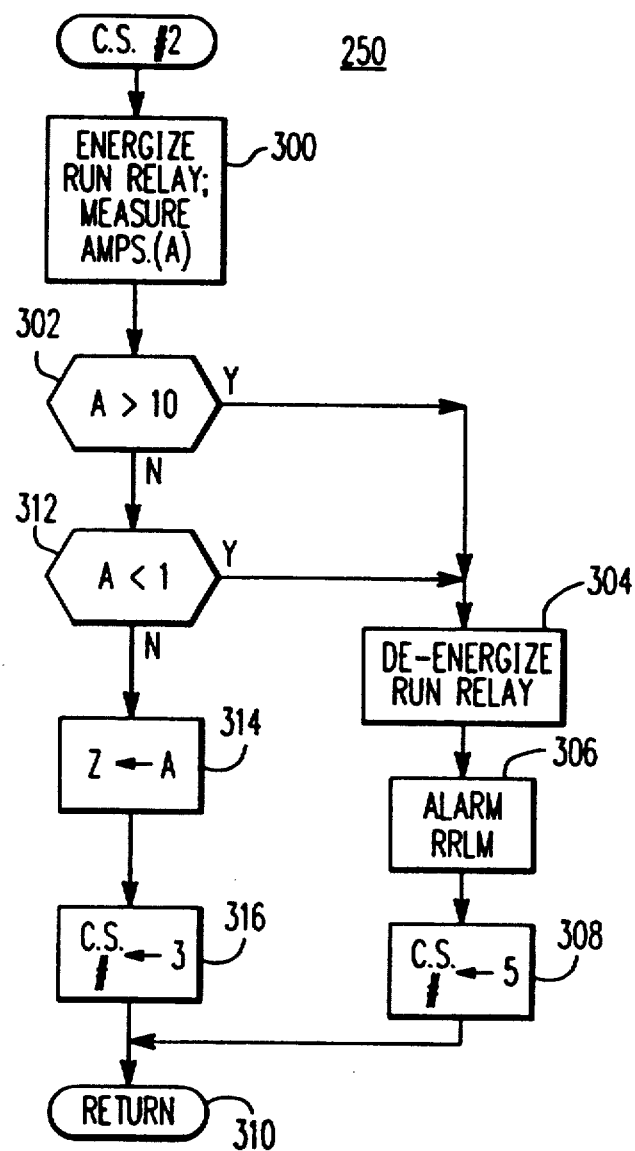
FIG. 5 is a flow diagram called by the program of FIG. 4 which checks a run relay and associated circuitry for current draw, and stores the value for use in later programs.

A program 250 for implementing case select function #2 is shown in FIG. 5, with program 250 being entered at 298. Step 300 energizes run relay 158 via conductor 220 and the resulting battery current is measured. The measured value will be called "value A" during this program. Letters at the start of the alphabet will be used to identify measured battery current values which are only used during the running of the associated program, and are lost when the program exits back to function 230. Letters at the end of the alphabet will be used to identify measured battery current values which are stored for later use, either in the same program or in subsequent programs.

Step 302 compares value A with a predetermined upper limit, e.g., 10 amperes, obtained from ROM 122. If the current draw exceeds the upper limit, step 304 de-energizes run relay 158, step 306 sets an alarm RRLM which identifies run relay 158 and associated circuitry as being out of allowable limits, and step 308 sets the case select number to 5. It will be noted that case select numbers 3 and 4 have been skipped, as with the run relay current out of limits, tests performed in programs for case select numbers 3 and 4, which are performed with run relay 158 energized, cannot be run.

If step 302 finds value A does not exceed the upper limit, step 312 determines if value A is less than a predetermined lower current limit, e.g., 1 ampere, obtained from ROM 122. If value A is less than the lower limit, step 312 goes to the hereinbefore described step 304. If step 314 finds value A is above the lower limit, then the current draw of run relay 158 and associated circuitry is within allowable limits and step 312 goes to step 314 which stores value A as stored value Z, for use in later programs. Step 316 sets the case select number to 3, and the program returns at 310 to function 230.

Figure 6:
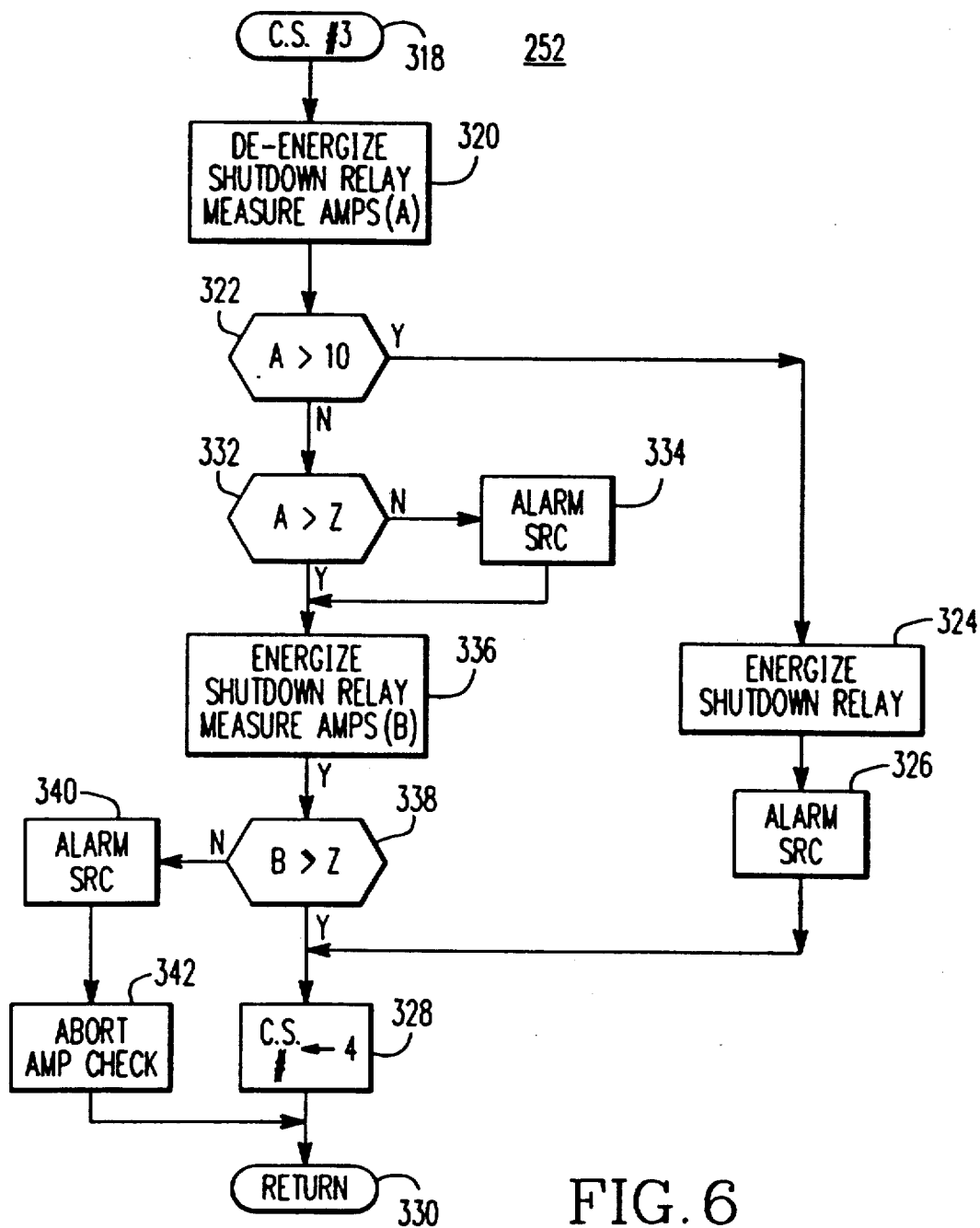
FIG. 6 is a flow diagram called by the program of FIG. 5 which checks a shut-down relay and associated circuitry for current draw.

A program 252 for implementing case select function #3 is shown in FIG. 6, with program 252 being entered at 318. Step 320 de-energizes shutdown relay 156, which causes its normally closed contacts 168 to close. Circuit protective switch SSW is connected into the battery circuit by contacts 168, as it will be noted that the program of FIG. 5 did not de-energize run relay 158. Conductor 175 is thus energized, and conductor 175 energizes switch SSW via a normally closed contact of ignition switch 144. The testing procedures with shutdown relay 156 de-energized are performed faster than the delay time of switch SSW, and thus SSW will not operate to open its contacts 134 during the testing procedure. Step 320 also measures the battery current drawn by run relay 158 and circuit protective switch SSW, with this measured battery current being called value A.

Step 322 then compares value A with a predetermined upper limit, e.g., 10 amperes, obtained from ROM 122. If value A exceeds this upper limit, step 324 energizes shutdown relay 156 to prevent switch SSW from operating, and step 326 sets an alarm SRC which identifies shutdown relay 156, switch SSW and associated circuitry as having a problem. Step 326 goes to step 328 which sets the case select number to 4, and the program returns to function 230 at 330.

If step 322 finds value A to be less than the upper current limit, step 322 goes to step 332 which compares value A with stored value Z. Value A should be greater than stored value Z since protective switch SSW normally draws about 2.5 amperes, compared with less than 1 ampere for the shutdown relay. Thus, if value A exceeds stored value Z, step 334 sets alarm SRC. Step 334 and the "yes" branch from comparison step 332 proceed to step 336. Step 336 energizes shutdown relay 156 and measures the battery current, which is called value B. Now only run relay 158 and shutdown relay 156 should be energized, and step 338 checks to see if value B equals or exceeds the stored value Z, which was stored in step 314 of FIG. 5. If shutdown relay 156 picked up in step 336, step 338 should find value B equal to stored value Z, and if so, step 338 advances to step 328 which sets the case select number to 4.

If value B is less than stored value Z, then step 340 is entered which sets alarm SRC which identifies a fault in the shutdown circuitry, and step 342 provides a signal which aborts the testing procedure, as with shutdown relay 156 not picking up, and with run relay 158 energized, switch SSW will soon cause its contacts 134 to open and terminate the test. The alarm SRC will notify the operator or tester what caused switch SSW to operate.

Figure 7:
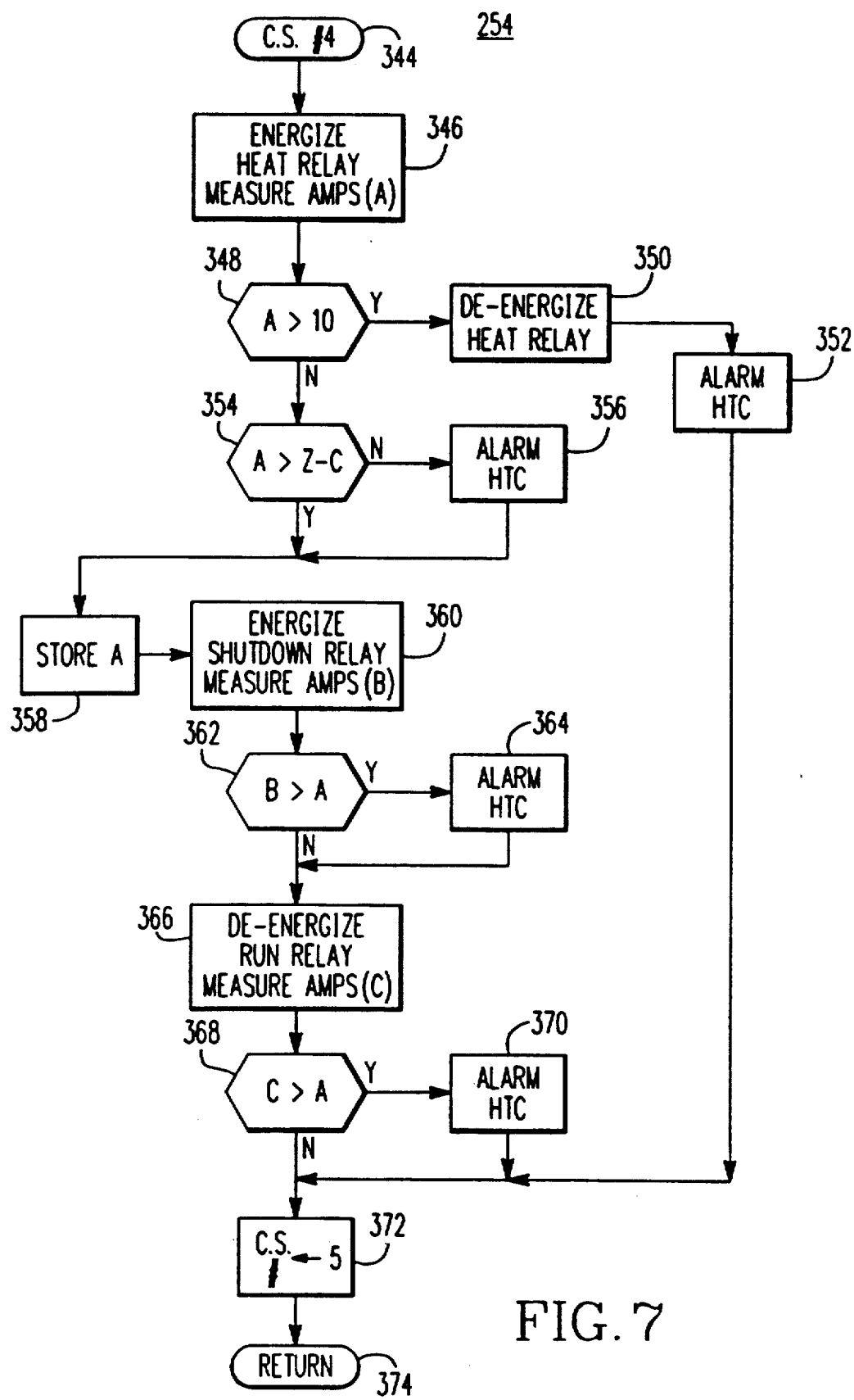
FIG. 7 is a flow diagram called by the program of FIG. 6 which checks a heat relay and associated circuitry for current draw, and performs another check on the run relay.

A program 254 for implementing case select function #4 is set forth in FIG. 7, with program 254 being entered at 344. It will be remembered that run relay 158 and shutdown relay 156 will both be energized at this point. Step 346 energizes heat relay 160, which should pick up and close its normally open contacts 176, energizing and thus opening the pilot solenoid PS. Step 346 measures the resulting battery current, which will be called value A. Step 348 obtains an upper current limit, e.g., 10 amperes, from ROM 122 and compares it with value A. If value A exceeds this predetermined upper current limit step 348 proceeds to step 350 which de-energizes heat relay 160, and step 352 sets an alarm HTC which identifies the heat relay and associated circuitry, including pilot solenoid PS, as having a problem.

If step 348 finds value A does not exceed the upper limit, step 354 determines if value A exceeds the store value Z. Value A represents the current drawn by shutdown relay 156, run relay 158, heat relay 160 and pilot solenoid PS, and it should exceed the stored value Z which represents the current draw of the run relay 158 and the shutdown relay 156. If not, step 356 sets alarm HTC, which identifies the heat relay 160 and associated circuitry as having a problem. Step 356 and the "yes" branch from step 354 both proceed to step 358 which stores value A for use later in this program.

Step 358 proceeds to step 360 which de-energizes heat relay 160, which also should de-energize pilot solenoid PS, and the resulting current is measured, which will be called value B. Step 362 checks to see if value B is greater than stored value A. If value B exceeds stored value A there is a problem, as with heat relay 160 and pilot solenoid PS de-energized, value B should be less than stored value A which includes the current draw of heat relay 160 and pilot solenoid PS. Accordingly, step 362 goes to step 364 which sets alarm HTC, to identify the heat relay and associated circuitry as having a problem. Step 364 and the "no" branch from step 362 go to step 366 which de-energizes run relay 158, and step 366 also measures the resulting battery current, which will be called value C.

Step 366 proceeds to step 368 which compares value C with stored value A. Value C should be less than stored value A because run relay 158 has been de-energized. If value C exceeds stored value A there is a problem in the run relay 158 and associated circuitry, and step 368 goes to step 370 which sets an alarm RRLM which identifies the run relay 158 and associated circuitry as being outside the allowable limits. Step 370, step 352, and the "no" branch from comparison step 368 both go to step 372 which sets case select to number 5, and program 254 returns to function 230 at 374. It should now be noted that in the subsequent programs, run relay 158 will be de-energized, having been de-energized in stp 366.

Figure 8:
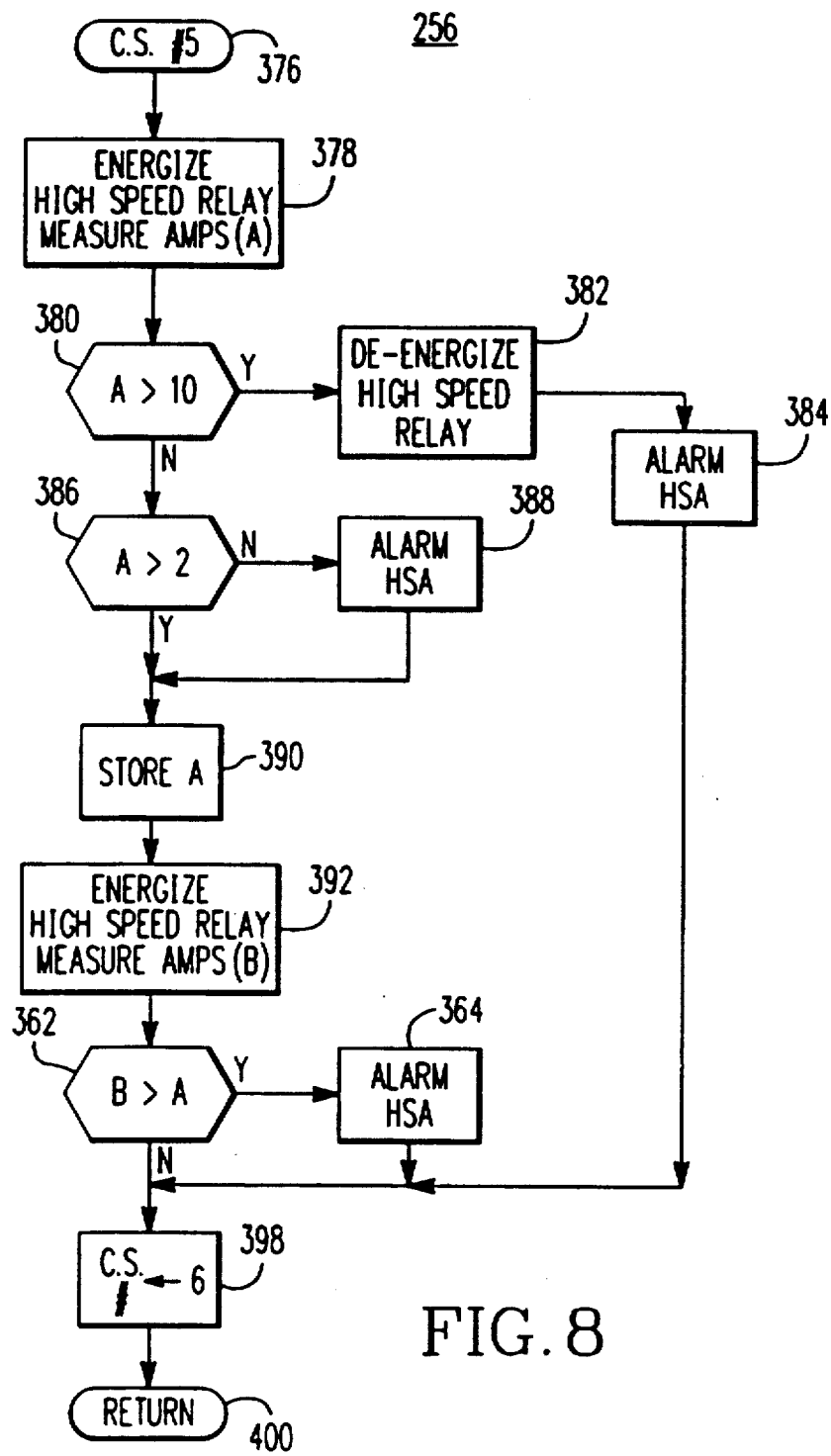
FIG. 8 is a flow diagram called by the programs of FIGS. 5 and 7 which checks a high speed relay and associated circuitry for current draw.

A program 256 for implementing case select function #5 is set forth in FIG. 8, with program 256 being entered at 376. Step 378 energizes high speed relay 162, which closes its normally open contacts 178 to energize high speed solenoid 120. Step 378 measures the resulting battery current, which will be called value A. Step 380 compares value A with an upper limit, e.g., 10 amperes, obtained from ROM 122, and if value A exceeds the upper limit, step 382 de-energizes high speed relay 162, and step 384 sets an alarm HSA which identifies the high speed relay 162 and its associated circuitry as the cause of the alarm.

If step 380 finds that value A does not exceed the upper limit, step 386 checks value A versus a lower limit, e.g., 2 amperes, obtained from ROM 122. If value A does not exceed the lower limit, step 388 sets the hereinbefore described alarm HSA. Step 388 and the "yes" branch from step 386 proceed to step 390. Step 390 stores value A for use later in this program. Step 392 then de-energizes high speed relay 162 and measures the resulting battery current, which will be called value B. Step 394 compares value B with stored value A. Value B should be less than stored value A since step 392 requested de-energization of the high speed relay, which should also result in the de-energization of high speed solenoid 120. If value B exceeds stored value A, then there is a problem in the high speed circuitry and step 396 sets the hereinbefore described alarm HSA.

Step 396, step 384, and the "no" branch from comparison step 394 all proceed to sep 398 which sets the case select number to 6, and program 256 returns to function 230 at 400.

Figure 9:
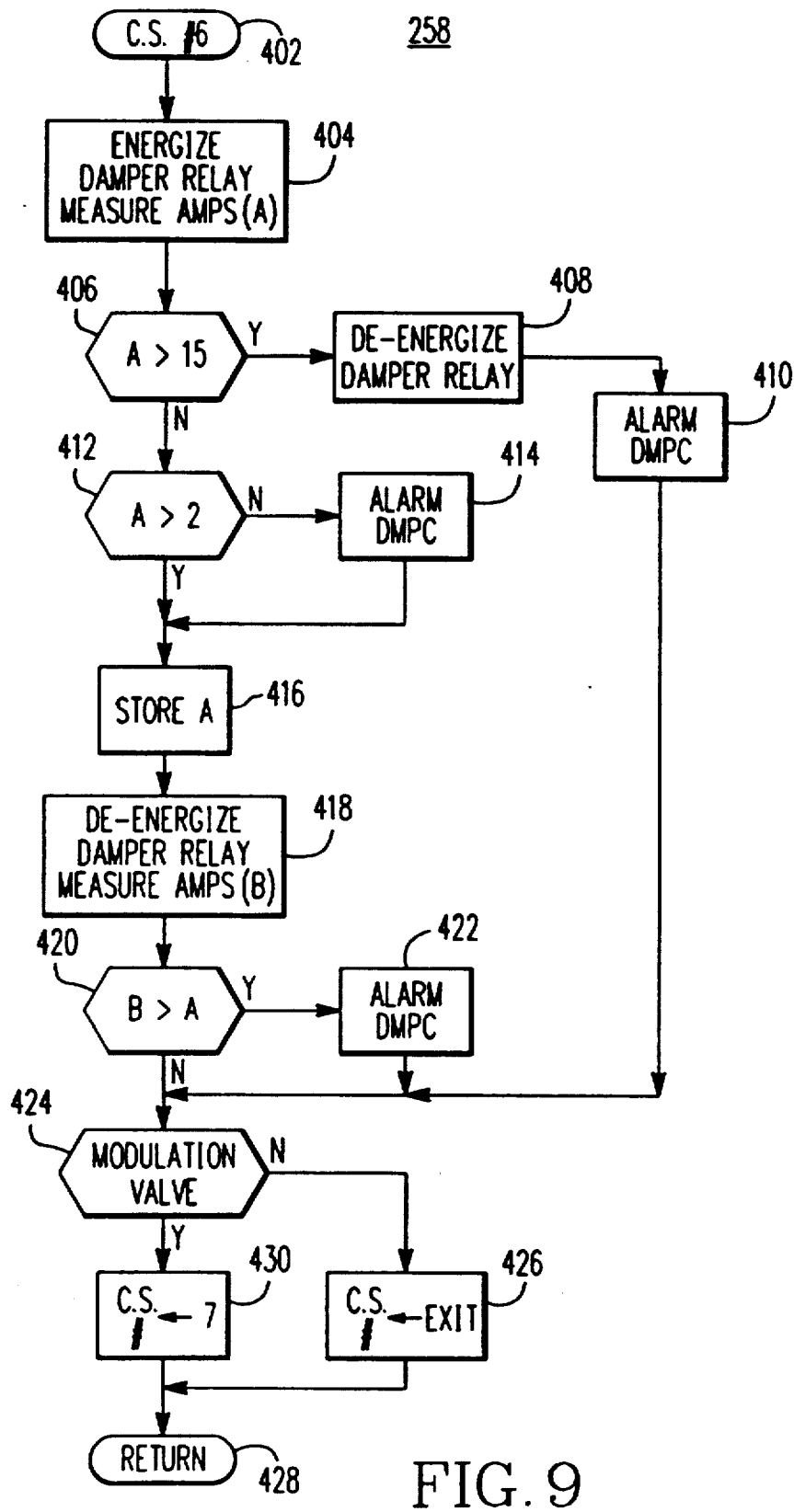
FIG. 9 is a flow diagram called by the program of FIG. 8 which checks a damper relay and associated circuitry for current draw.

A program 258 for implementing case select function #6 is set forth in FIG. 9, with program 258 being entered at 402. Step 404 energizes damper relay 164, which closes its normally open contacts 180 to energize damper solenoid 184. Step 404 measures the resulting battery current, which will be called value A. Step 406 compares value A with an upper limit, e.g., 15 amperes, obtained from ROM 122, and if value A exceeds the upper limit, step 408 de-energizes damper relay 164, and step 410 sets an alarm DMPC which identifies damper relay 164 and its associated circuitry as the cause of the alarm.

If step 406 finds that value A does not exceed the upper limit, step 412 checks value A versus a lower limit, e.g., 2 amperes, obtained from ROM 122. If value A does not exceed the lower limit, step 414 sets the hereinbefore described alarm DMPC. Step 414 and the "yes" branch from step 412 proceed to step 416, which stores value A for use later in this program. Step 418 then de-energizes damper relay 164 and measures the resulting battery current, which will be called value B. Step 420 compares value B with stored value A. Value B should be less than stored value A since step 418 requested de-energization of damper relay 164, which should also result in the de-energization of damper solenoid 184. If value B exceeds stored value A, then there is a problem in the damper circuitry, and step 422 sets the hereinbefore described alarm DMPC.

Figure 10:
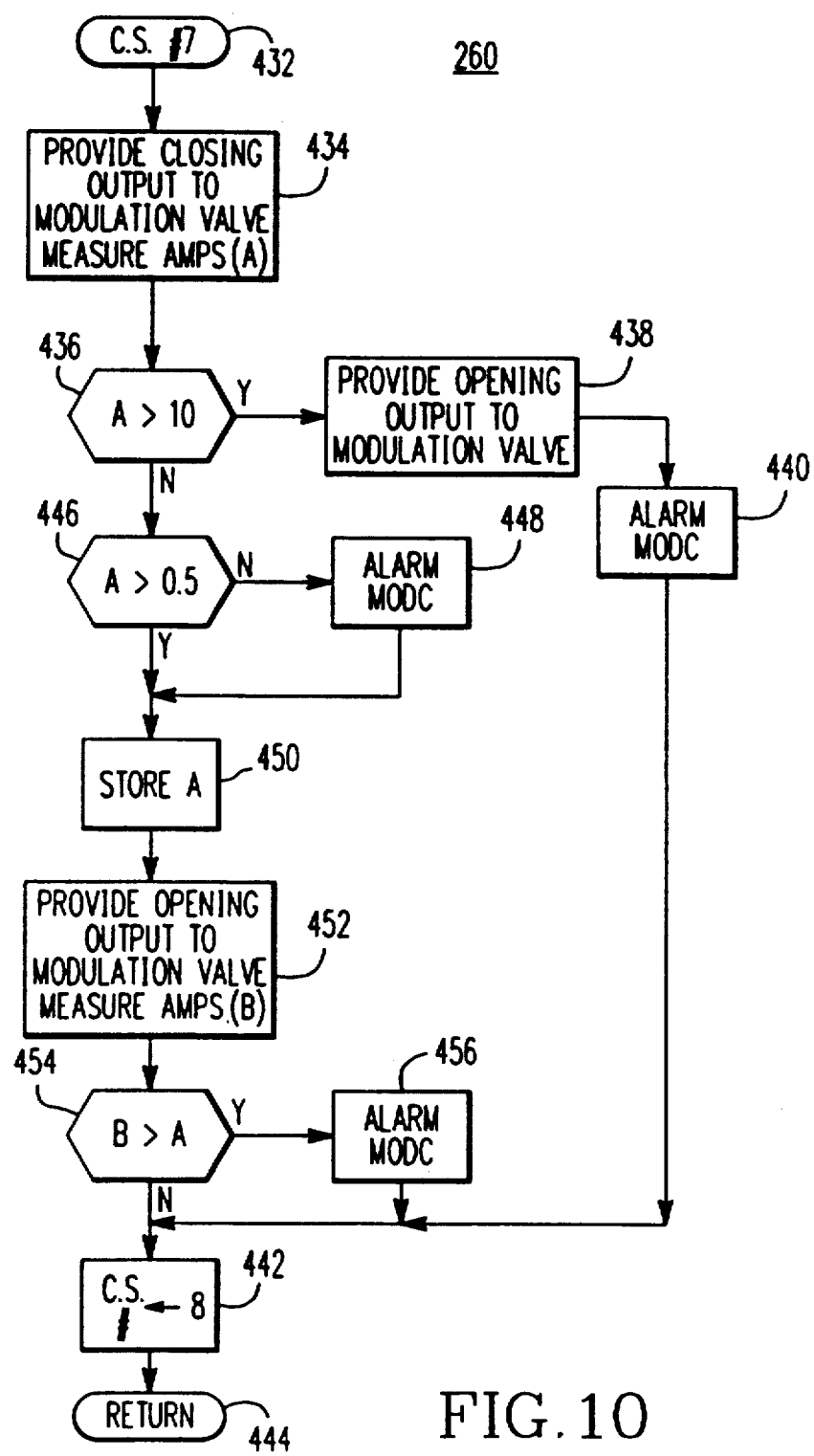
FIG. 10 is a flow diagram called by the program of FIG. 9 which checks a suction line modulation valve and associated circuitry for current draw.

Step 422, step 410, and the "no" branch from comparison step 420 all proceed to step 424 which checks to see if a modulation valve present flag MVPF is true, indicating suction line modulation valve 64 is in suction line 68. If there is no suction line modulation valve, the test procedure has been completed and step 426 sets the case select number to "exit", and program 258 returns to function 230 at 428. If step 424 finds a modulation valve 64 is present, then step 430 sets case select to number 7, and the program returns to function 230 at 428. A program 260 for implementing case select function #7 is set forth in FIG. 10, with program 260 being entered at 432. Step 434 provides an output, i.e., a current sinking circuit, which should cause a current value to flow from battery 126 through valve 64 sufficient to close valve 64. Step 434 measures the battery current, called value A. Step 436 compares value A with a predetermined upper limit, e.g., 10 amperes, obtained from ROM 122, and if value A exceeds this upper limit, step 438 opens modulation valve 64 by allowing the valve current to decay to 0, and step 440 sets alarm MODC which identifies the modulation valve 64 and its associated circuitry as having a problem.

If value A does not exceed the upper limit, step 436 proceeds to check value A versus a lower limit, e.g., 0.5 ampere, obtained from ROM 122, and if value A does not exceed the lower limit, step 448 sets the hereinbefore mentioned alarm MODC. Step 448 and the "yes" branch from comparison step 446 proceed to step 450 which stores value A for use later in this program. Step 452 then provides an output which should cause the current through modulation valve 64 to decay to 0 and open the valve. Step 452 delays for a period of time for the valve to pen, and then measures the battery current, which will be called value B.

Step 454 checks to see if value B exceeds stored value A. It should not exceed it, since step 452 should have reduced the valve current to 0. If value B does exceed stored value A, then step 456 sets the hereinbefore mentioned alarm MODC. Step 456, step 440, and the "no" branch from comparison step 454 all proceed to step 442, which sets the case select number to 8, and program 260 returns to function 230 at 444.

Figure 11:
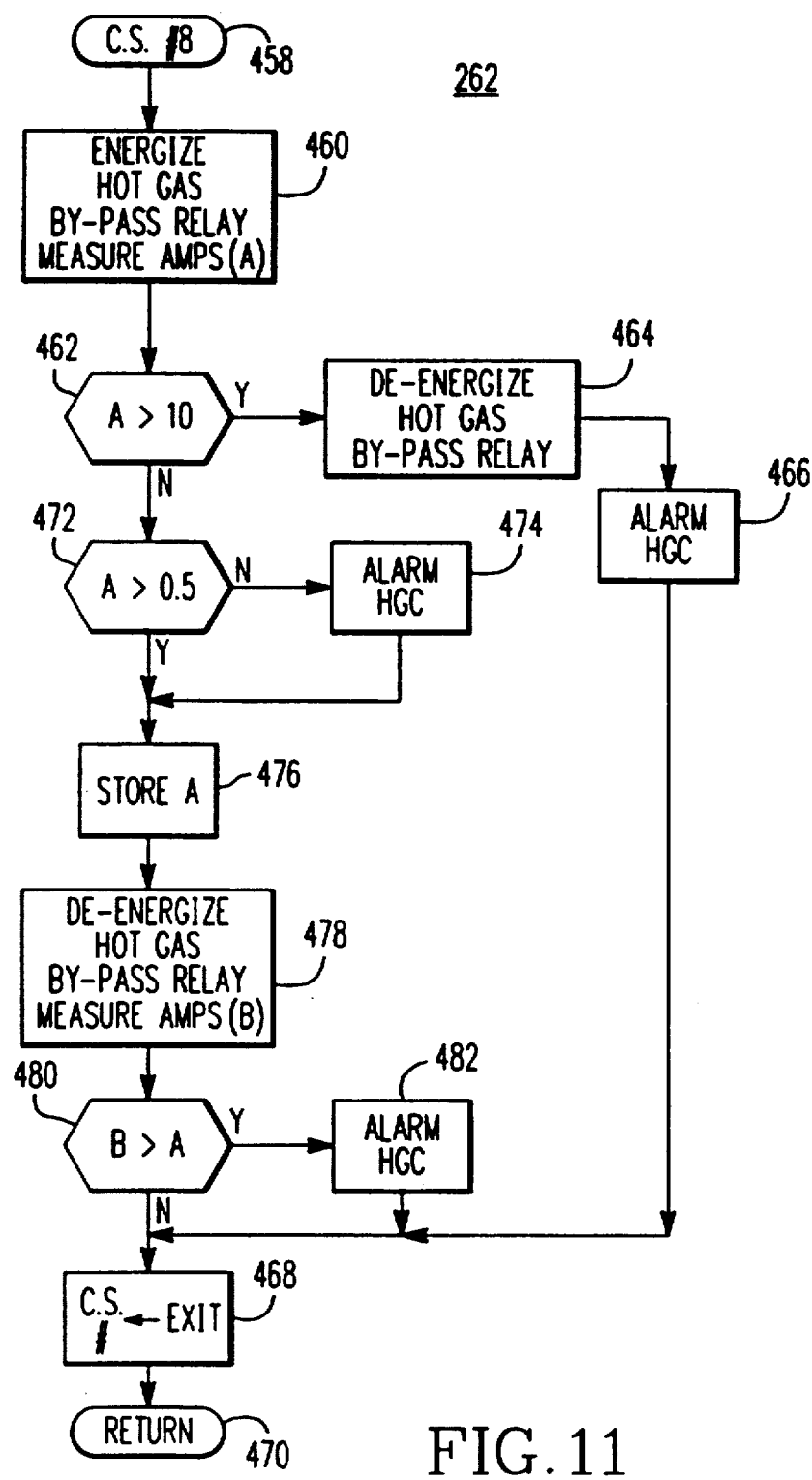
FIG. 11 is a flow diagram called by the program of FIG. 10 which checks a hot gas by-pass relay and associated circuitry for current draw.

A program 262 for implementing case select function #8 is set forth in FIG. 11, with program 258 being entered at 458. Step 460 energizes hot gas by-pass relay 166, which closes its normally open contacts 186 to energize hot gas solenoid 188. Step 460 measures the resulting battery current, which will be called value A. Step 462 compares value A with an upper limit, e.g., 10 amperes, obtained from ROM 122, and if value A exceeds the upper limit, step 464 de-energizes hot gas by-pass relay 164, and step 466 sets an alarm HGC which identifies hot gas by-pass relay 166 and its associated circuitry as the cause of the alarm.

If step 462 finds that value A does not exceed the upper limit, step 472 checks value A versus a lower limit, e.g., 0.5 ampere, obtained from ROM 122. If value A does not exceed the lower limit step 472 sets the hereinbefore described alarm HGC. Step 474 and the "yes" branch from comparison step 472 proceed to step 476, which stores value A for use later in this program. Step 476 then proceeds to step 478 which de-energizes hot gas by-pass relay 166 and measures the resulting battery current, which will be called value B. Step 480 compares value B with stored value A. Value B should be less than stored value A since step 478 requested de-energization of hot gas by-pass relay 166, which should also result in the de-energization of hot gas solenoid 188. If value B exceeds stored value A, then there is a problem in the hot gas by-pass circuitry and step 482 sets the hereinbefore described alarm HGC.

Step 482, sep 466, and the "no" branch from comparison step 480 all proceed to step 468 which sets the case select number to "exit", to indicate to function 230 that the testing procedure has been completed, and program 262 returns to function 230 at 470.

We claim:

1. A method of checking electrical components and associated wiring of electrical control associated with a microprocessor controlled transport refrigeration system having a prime mover which includes an internal combustion engine, with the prime mover driving a refrigerant compressor and an alternator, and with the electrical control including a battery, comprising the steps of:
   turning the prime mover off so the alternator output is zero,
   providing a DC current shunt to directly measure battery current,
   providing upper and lower battery current draw limits for each of a predetermined plurality of electrical components of the electrical control,
   energizing and de-energizing each of said plurality of electrical components, by individually, successively, and automatically connecting, without human intervention, each component to, and disconnecting it from, the battery,
   comparing the directly measured battery current draw of each of said plurality of electrical components, when energized, with the associated battery current draw limits, providing an alarm when a directly measured battery current draw is outside the associated draw limits, and identifying the electrical component whose directly measured battery current draw is outside the associated draw limits.

2. The method of claim 1 including the steps of:

providing predetermined upper and lower voltage limits for the battery, measuring the battery voltage, comparing the battery voltage with said voltage limits, and providing an alarm which indicates the battery voltage is outside the predetermined upper and lower limits in response to the comparison step finding that the battery voltage is not within the upper and lower voltage limits.

3. A method of checking electrical components and associated wiring of electrical control associated with a microprocessor controlled transport refrigeration system having a prime mover which includes an internal combustion engine having glow plug resistors for pre-heating the engine, with the prime mover driving a refrigerant compressor and an alternator, and with the electrical control including a battery and a pre-heat relay which, when energized, energizes the glow plug resistors, comprising the steps of:

turning the prime mover off so the alternator output is zero, providing predetermined upper and lower voltage limits for the battery, measuring the battery voltage, comparing the battery voltage with said voltage limits, providing an alarm which indicates the battery voltage is outside the predetermined upper and lower limits in response to the comparison step finding that the battery voltage is not within the upper and lower voltage limits, providing a current shunt to measure battery current, providing upper and lower battery current draw limits for each of a predetermined plurality of electrical components of the electrical control, energizing and de-energizing each of said plurality of electrical components, by individually and successively connecting each component to, and disconnecting it from, the battery, comparing the battery current draw of each of said plurality of electrical components, when energized, with the associated battery current draw limits, providing an alarm when a battery current draw is outside the associated draw limits, identifying the electrical component whose battery current draw is outside the associated draw limits, said step of providing battery current draw limits providing predetermined upper and lower battery current limits for current collectively drawn by the pre-heat relay and glow plug resistors, energizing the pre-heat relay and glow plug resistors, measuring the battery current drawn by the energized pre-heat relay and glow plug resistors, comparing the measured battery current with the predetermined upper limit, providing an alarm which indicates the glow plug current is out of limits when the comparison step finds the measured battery current exceeds the predetermined upper current limit, comparing the measured battery current with the predetermined lower current limit, providing an additional lower limit for the battery voltage which is lower than the predetermined lower limit previously sued to check the battery voltage, comparing the battery voltage with the additional lower limit when the comparison step finds the measured battery current is less than the predetermined lower current limit, providing an alarm which identifies the glow plugs when the measured current is below the predetermined lower limit and the battery voltage is above the additional lower voltage limit, and providing an alarm which identifies the battery when the measured current is below the predetermined lower limit and the battery voltage is below the additional lower voltage limit.

4. A method of checking electrical components and associated wiring of electrical control associated with a microprocessor controlled transport refrigeration system having a prime mover which includes an internal combustion engine, with the prime mover driving a refrigerant compressor and an alternator, and with the electrical control including a battery, and a run relay which is energized when the engine is the prim mover, comprising the steps of:

turning the prime mover off so the alternator output is zero, providing a current shunt to measure battery current, providing upper and lower battery current draw limits for each of a predetermined plurality of electrical components of the electrical control, including the run relay, energizing and de-energizing each of said plurality of electrical components, by individually and successively connecting each component to, and disconnecting it from, the battery, comparing the battery current draw of each of said plurality of electrical components, when energized, with the associated battery current draw limits, providing an alarm when a battery current draw is outside the associated draw limits, identifying the electrical component whose battery current draw is outside the associated draw limits, said step of energizing electrical components including the step of energizing the run relay, de-energizing the run relay only if the battery current drawn by the run relay is outside the predetermined upper and lower battery current limits for the run relay, and storing the battery current drawn by the energized run relay as value Z when the battery current drawn by the run relay is within the predetermined upper and lower limits.

5. The method of claim 4 wherein the electrical control includes a shutdown relay which is energized when shutdown of the transport refrigeration system is not required, and which shuts down the transport refrigeration system when de-energized by connecting protective means across the battery which, after a period of time, operates to open contacts associated therewith which are connected in a circuit which provides battery voltage to the electrical control, and including the steps of:

maintaining the run relay in the energized condition when the battery current drawn by the run relay is within the predetermined upper and lower limits, with the run relay, when energized, providing battery voltage to the shutdown relay, de-energizing the shutdown relay to provide current flow through the protective means, providing a predetermined upper battery current limit for the combined current flow of the protective means and the run relay, measuring the battery current drawn by the run relay and the protective means, comparing value A with the predetermined upper battery current limit, energizing the shutdown relay when the comparing step finds value A exceeds the predetermined upper current limit, providing an alarm which identifies the shutdown relay when the comparing step finds value A exceeds the predetermined upper current limit, comparing value A with the previously stored battery current value Z associated with the run relay, when value A does not exceed the upper limit, providing an alarm which identifies the shutdown relay when the comparison step finds value A does not exceed the stored value Z, energizing the shut down relay when the comparison steps find value A does not exceed the upper current limit, and value A does exceed the stored value Z, measuring the battery current (value B) after the shut down relay is energized, comparing value B with the stored value Z, providing an alarm which identifies the shut down relay when the comparing step finds value B does not exceed stored value Z, and terminating the checking of any further electrical components when the comparison step finds value B does not exceed the stored value Z.

6. The method of claim 4 wherein the transport refrigeration system maintains a predetermined set point temperature in a space to be conditioned via heating and cooling cycles, and wherein the electrical control includes a heat relay and a pilot solenoid valve which are energized when the transport refrigeration system requires a heating cycle, and de-energized when the transport refrigeration system requires a cooling cycle, and including the steps of :

maintaining the run relay in the energized condition when the battery current drawn by the run relay is within the predetermined upper and lower limits, with the run relay providing battery voltage to the heat relay when energized, and with the heat relay, when energized, energizing the pilot solenoid valve, energizing the heat relay and the pilot solenoid valve, measuring the battery current (value A) drawn by the energized heat relay, pilot solenoid valve, and run relay, providing an upper current limit for the energized heat relay, pilot solenoid valve and run relay, comparing value A with the upper current limit, providing an alarm which identifies the heat relay when the comparison step finds value A exceeds the upper current limit, comparing value A with value Z, providing an alarm which identifies the heat relay when the comparison step finds that value A does not exceed value Z, de-energizing the heat relay, measuring the battery current (value B) after the heat relay is de-energized, comparing value B with value A, and providing an alarm which identifies the heat relay when the comparison step finds value B exceeds value A.

7. The method of claim 6 including the steps of:

de-energizing the run relay, measuring the battery current (value C) after the run relay is de-energized, comparing value C with value A, and providing an alarm which identifies the run relay when the comparison step finds value C exceeds value A.

8. A method of checking electrical components and associated wiring of electrical control associated with a microprocessor controlled transport refrigeration system having a prime mover which includes an internal combustion engine, with the prime mover driving a refrigerant compressor and an alternator, and with the electrical control including a battery, comprising the steps of:

turning the prime mover off so the alternator output is zero, providing a current shunt to measure battery current, providing upper and lower battery current draw limits for each of a predetermined plurality of electrical components of the electrical control, energizing and de-energizing each of said plurality of electrical components, by individually and successively connecting each component to, and disconnecting it from, the battery, comparing the battery current draw of each of said plurality of electrical components, when energized, with the associated battery current draw limits, providing an alarm when a battery current draw is outside the associated draw limits, identifying the electrical component whose battery current draw is outside the associated draw limits, storing the measured battery current as value A when at least one of the electrical components is energized, measuring the battery current (value B) after the at least one electrical component is de-energized, comparing value B with value A, and providing an alarm which identifies the at least one electrical component when value B exceeds value A.

9. A method of checking electrical components and associated wiring of electrical control associated with a microprocessor controlled transport refrigeration system having a controllable suction line modulation valve which closes in response to a predetermined current flow therethrough, and which opens with zero current, a prime mover which includes an internal combustion engine, with the prime mover driving a refrigerant compressor and an alternator, and with the electrical control including a battery, comprising the steps of:

turning the prime mover off so the alternator output is zero, providing a current shunt to measure battery current, providing upper and lower battery current draw limits for each of a predetermined plurality of electrical components of the electrical control, energizing and de-energizing each of said plurality of electrical components, by individually and successively connecting each component to, and disconnecting it from, the battery, comparing the battery current draw of each of said plurality of electrical components, when energized, with the associated battery current draw limits, providing an alarm when a battery current draw is outside the associated draw limits, identifying the electrical component whose battery current draw is outside the associated draw limits, providing on output to the modulation valve which would normally provide the predetermined valve closing current, measuring the battery current (value A) after a time sufficient for the modulation valve to close, providing predetermined upper and lower current limits for the modulation valve when closed, comparing value A with the upper and lower current limits, providing an alarm which identifies the modulation valve when value A is outside the upper and lower current limits, providing on output to the modulation valve which would normally provide the zero valve opening current, measuring the battery current (value B) after a time sufficient for the modulation valve to open, comparing value B with value A, and providing an alarm which identifies the modulation valve when value B exceeds value A.

* * * * *